(12) United States Patent
Kim et al.

(10) Patent No.: US 10,916,563 B2
(45) Date of Patent: Feb. 9, 2021

(54) SEMICONDUCTOR DEVICE INCLUDING WORD LINE CUT

(71) Applicant: SAMSUNG ELECTRONICS CO., LTD., Suwon-si (KR)

(72) Inventors: Young Woo Kim, Hwaseong-si (KR); Joon Young Kwon, Hwaseong-si (KR); Jung Hwan Lee, Hwaseong-si (KR); Jung Tae Sung, Hwaseong-si (KR); Ji Min Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/453,094

(22) Filed: Jun. 26, 2019

(65) Prior Publication Data

US 2020/0203366 A1 Jun. 25, 2020

(30) Foreign Application Priority Data

Dec. 24, 2018 (KR) .................. 10-2018-0168796

(51) Int. Cl.
*H01L 27/11582* (2017.01)
*H01L 27/11565* (2017.01)
*H01L 27/1157* (2017.01)

(52) U.S. Cl.
CPC ..... *H01L 27/11582* (2013.01); *H01L 27/1157* (2013.01); *H01L 27/11565* (2013.01)

(58) Field of Classification Search
CPC ......... H01L 27/11582; H01L 27/11565; H01L 27/1157
See application file for complete search history.

(56) References Cited

U.S. PATENT DOCUMENTS

| 8,877,587 | B2 | 11/2014 | Noh |
| 9,299,717 | B2 | 3/2016 | Lee et al. |
| 9,397,043 | B1* | 7/2016 | Minemura ........ H01L 27/11582 |
| 9,899,406 | B2 | 2/2018 | Kim et al. |
| 2014/0035024 | A1 | 2/2014 | Noh |

(Continued)

FOREIGN PATENT DOCUMENTS

| KR | 1020080092548 | 10/2008 |
| KR | 1020160136919 | 11/2016 |
| KR | 1020180007811 | 1/2018 |

*Primary Examiner* — Selim U Ahmed
*Assistant Examiner* — Evan G Clinton
(74) *Attorney, Agent, or Firm* — F. Chau & Associates, LLC

(57) ABSTRACT

A semiconductor device includes a substrate having a cell region and an extension region, channel structures disposed in the cell region and extending in a first direction substantially perpendicular to an upper surface of the substrate, gate electrode layers surrounding the channel structures and stacked to be spaced apart from each other in the first direction and to extend in a second direction substantially perpendicular to the first direction, and word line cuts cutting the gate electrode layers in the first direction and continuously extending in the second direction. At least one of the word line cuts is an extension word line cut with an extension portion having an area that is different from those of the remaining word line cuts located at the same level as the at least one word line cut in a predetermined region extending in the second direction.

19 Claims, 10 Drawing Sheets

(56) References Cited

U.S. PATENT DOCUMENTS

2014/0346682 A1    11/2014  Lee et al.
2016/0056171 A1*    2/2016  Manorotkul ...... H01L 21/02532
                                                              257/66
2017/0098601 A1     4/2017  Lim et al.
2017/0104000 A1*    4/2017  Park .................. H01L 27/11582

* cited by examiner

SEMICONDUCTOR DEVICE INCLUDING WORD LINE CUT

CROSS-REFERENCE TO RELATED APPLICATIONS

This application claims priority under 35 U.S.C. § 119 to Korean Patent Application No. 10-2018-0168796, filed on Dec. 24, 2018, the disclosure of which is incorporated by reference herein in its entirety.

TECHNICAL FIELD

Exemplary embodiments of the present inventive concept relate to a vertical type semiconductor device including gate electrode layers which are vertically stacked and a word line cut.

DISCUSSION OF THE RELATED ART

In an effort to achieve high integration density of a memory device, a vertical type memory device in which memory cells are vertically stacked from a surface of a substrate has been developed. In the vertical type memory device, a pillar or cylinder shaped channel vertically protruding from an upper surface of a substrate is provided, and a plurality of gate lines and insulating films in contact with the channel may be stacked. To further increase a capacity of the vertical type memory device, a larger number of the gate lines and the insulating films may be stacked in a vertical direction.

SUMMARY

Exemplary embodiments of the inventive concept are directed to providing a vertical type semiconductor device capable of preventing a not-open defect phenomenon which may occur at a word line cut.

According to an exemplary embodiment, a semiconductor device includes a substrate including a cell region and an extension region, a plurality of channel structures disposed in the cell region and extending in a first direction substantially perpendicular to an upper surface of the substrate, and a plurality of gate electrode layers surrounding the channel structures. The gate electrode layers are spaced apart from each other in the first direction and extend in a second direction substantially perpendicular to the first direction. The semiconductor device further includes a plurality of word line cuts cutting the gate electrode layers in the first direction and continuously extending in the second direction. At least one of the word line cuts is an extension word line cut including an extension portion having an area that is different from an area of each of the remaining word line cuts other than the at least one word line cut located at the same level as the at least one word line cut in a first predetermined region extending in the second direction.

According to an exemplary embodiment, a semiconductor device includes a substrate, a plurality of channel structures extending in a first direction substantially perpendicular to an upper surface of the substrate, and a plurality of gate electrode layers surrounding the channel structures. The gate electrode layers are stacked in a form of a cascade shape so as to be spaced apart from each other in the first direction and to extend in a second direction substantially perpendicular to the first direction. The semiconductor device further includes a plurality of word line cuts cutting the gate electrode layers in the first direction and extending in the second direction, and a connector connecting gate electrode layers disposed on a same layer and protruding from each of the gate electrode layers. The word line cuts include extension word line cuts having an extension portion, and separation word line cuts separated by the connector.

According to an exemplary embodiment, a semiconductor device includes a substrate, a plurality of channel structures extending in a first direction substantially perpendicular to an upper surface of the substrate, and a plurality of gate electrode layers surrounding the channel structures. The gate electrode layers are spaced apart from each other in the first direction and extend in a second direction substantially perpendicular to the first direction. The semiconductor device further includes a plurality of common source lines cutting the gate electrode layers in the first direction and extending in the second direction, and a connector connecting gate electrode layers disposed on the same layer and protruding from each of the gate electrode layers. At least one of the common source lines is separated by the connector, and a width of the at least one common source line is gradually increased in the second direction.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1A:
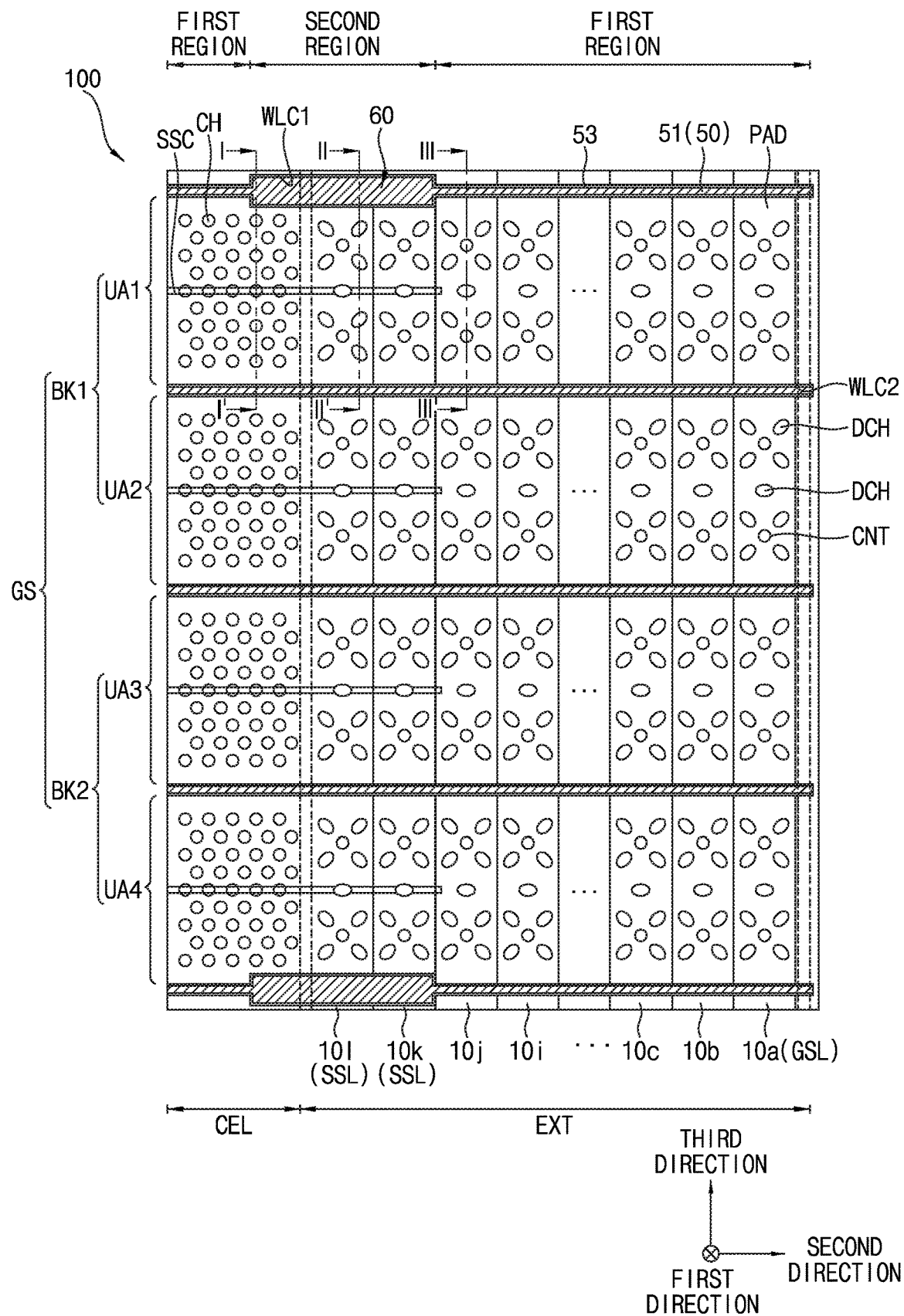
FIG. 1A is a layout schematically illustrating a semiconductor device according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present.

Figure 1B:
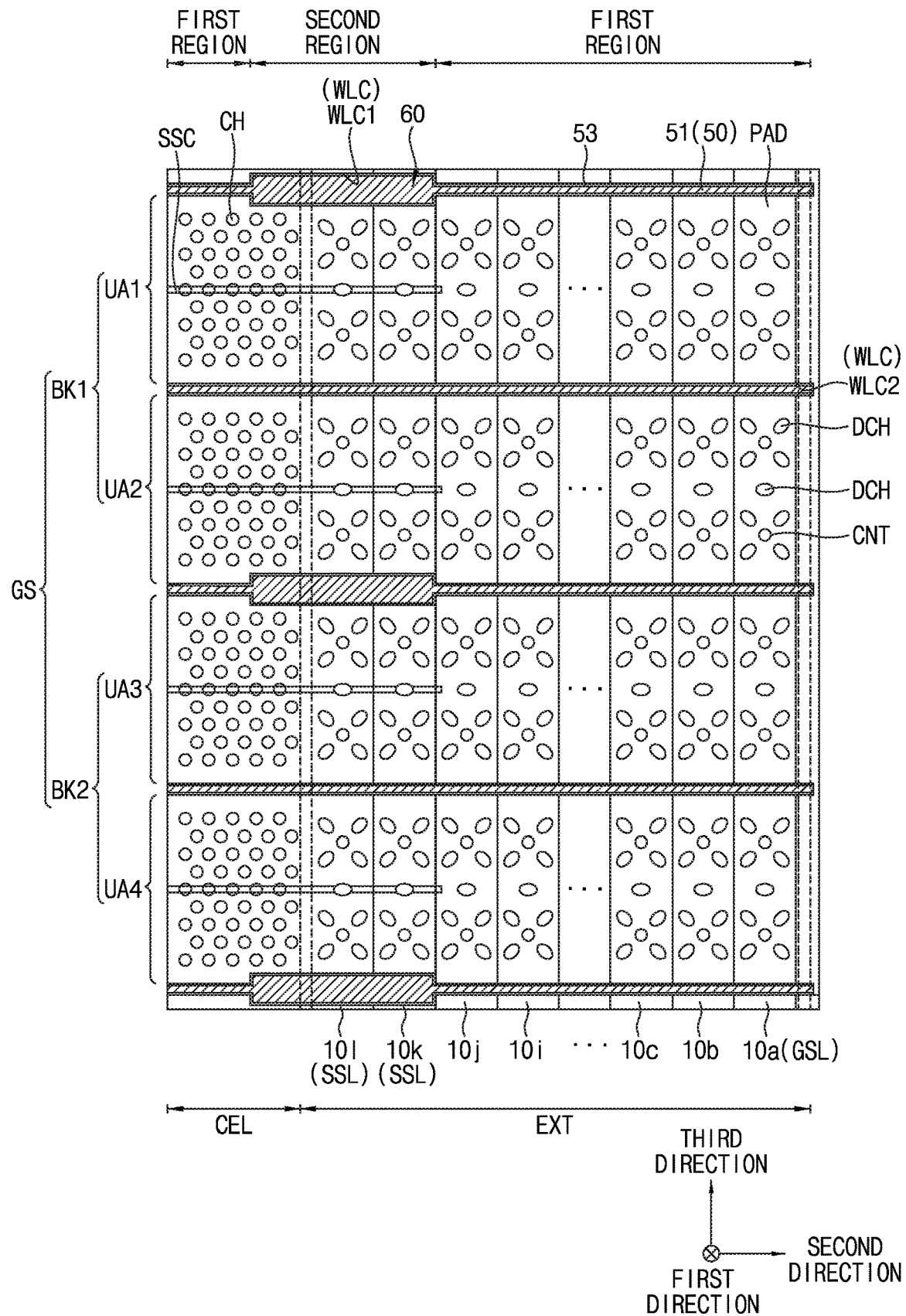
FIG. 1B is a layout schematically illustrating a semiconductor device according to an exemplary embodiment of the inventive concept.
Figure 2:
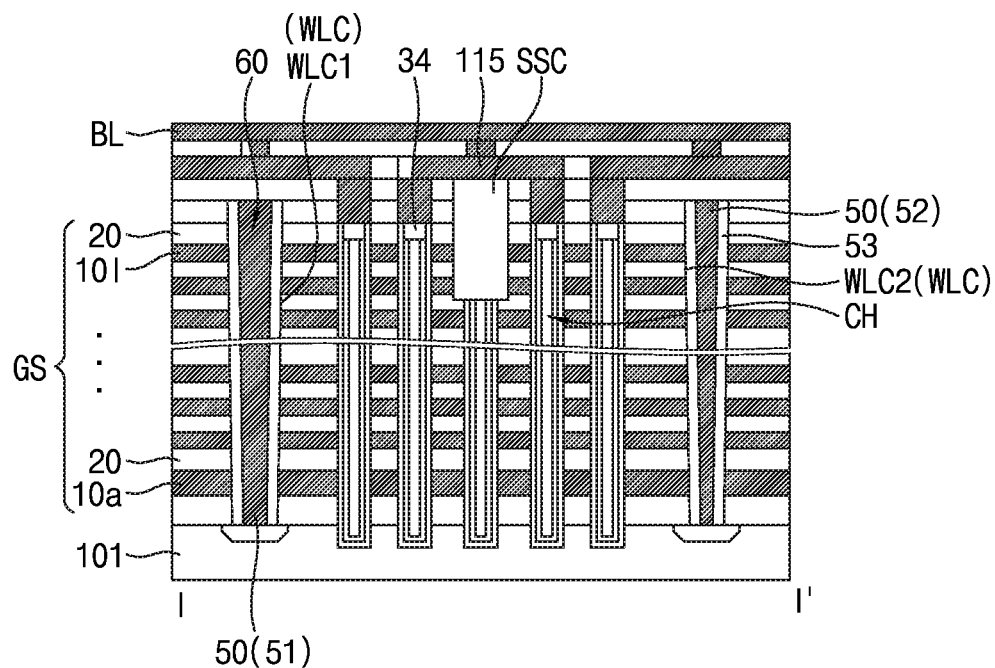
FIG. 2 is a cross-sectional view taken along line I-I' of FIG. 1A.
Figure 3:
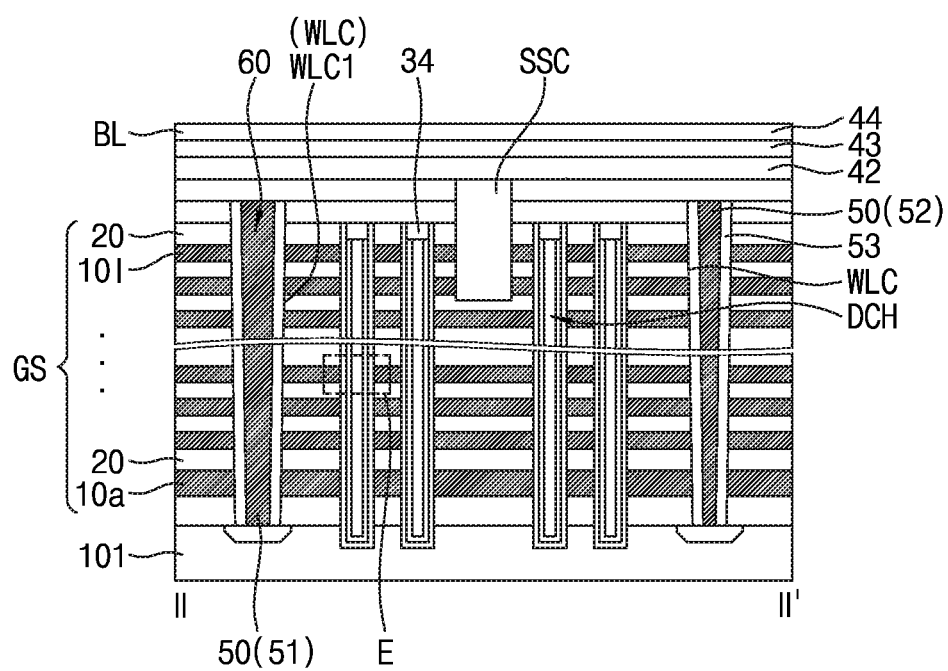
FIG. 3 is a cross-sectional view taken along line II-II' FIG. 1A.
Figure 4:
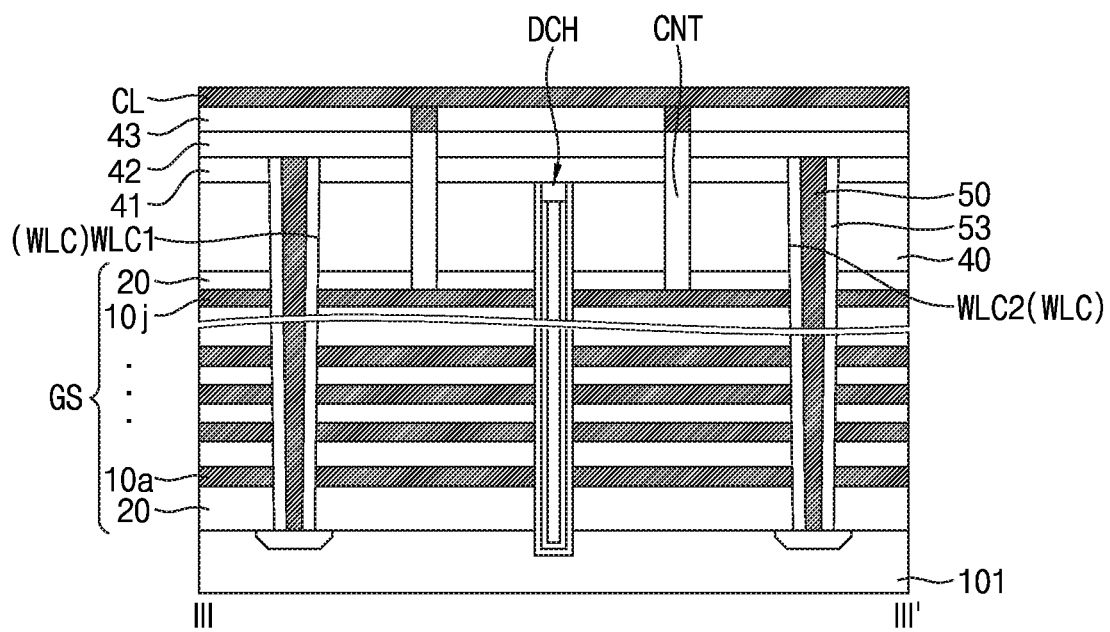
FIG. 4 is a cross-sectional view taken along line III-III' of FIG. 1A.
Figure 5:
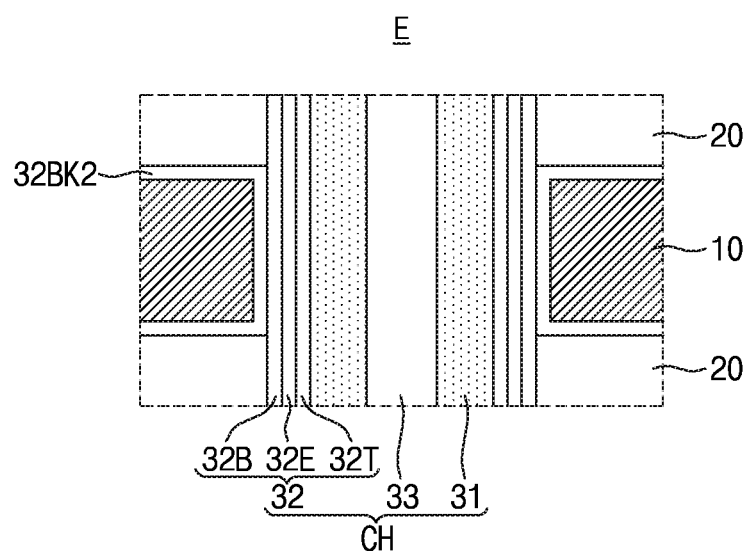
FIG. 5 is an enlarged view of region E of FIG. 3.

FIG. 1A is a layout schematically illustrating a semiconductor device according to an exemplary embodiment of the inventive concept. FIG. 1B is a layout schematically illustrating a semiconductor device according to an exemplary embodiment of the inventive concept. FIG. 2 is a cross-sectional view taken along line I-I' of FIG. 1A. FIG. 3 is a cross-sectional view taken along line II-II' of FIG. 1A. FIG. 4 is a cross-sectional view taken along line of FIG. 1A. FIG. 5 is an enlarged view of region E of FIG. 3.

Referring to FIG. 1A, a semiconductor device 100 may include a cell region CEL in which memory cells are formed and an extension region EXT in which the memory cells are connected to lines. FIG. 1A shows a portion of the cell region CEL. Although the extension region EXT is shown as being disposed on one side of the cell region CEL, the inventive concept is not limited thereto. For example, in an exemplary embodiment, the extension region EXT may be disposed on both sides of the cell region CEL. A peripheral circuit region may be disposed on an outer side of the extension region EXT, and a plurality of transistors constituting a drive circuit, a read/write circuit, and a control circuit may be disposed in the peripheral circuit region. Alternatively, the peripheral circuit region may be disposed under the cell region CEL and the extension region EXT.

Referring to FIGS. 1A, 1B and 2 to 4, the semiconductor device 100 may include a substrate 101, a gate structure GS, cell channel structures CH, dummy channel structures DCH, word line cuts WLC, common source lines 50, insulating spacers 53, contacts CNT, separation insulating patterns SSC, a mold insulating layer 40, upper insulating layers 41, 42, 43 and 44, a bit line BL, and a connection line CL.

The substrate 101 may be a semiconductor substrate. The substrate 101 may include, for example, a silicon wafer, an epitaxially grown SiGe wafer, or a silicon on insulator (SOI) wafer.

The gate structure GS may be disposed on the substrate 101. The gate structure GS may be formed such that gate electrode layers 10 (10a to 10l) and interlayer insulating layers 20 are alternately and repeatedly stacked in a direction substantially perpendicular to the substrate 101. The gate electrode layers 10 may be electrically separated from each other by the interlayer insulating layers 20.

Herein, when a first component is described as extending in a direction substantially perpendicular or parallel to a second component or direction, it is to be understood that the first component extends in a direction exactly perpendicular or parallel to the second component or direction, or extends in a direction approximately perpendicular or parallel to the second component or direction within a measurement error as would be understood by a person having ordinary skill in the art.

The gate electrode layers 10 and the interlayer insulating layers 20 may be paired, and the gate electrode layers 10 may extend with different lengths in a first direction to provide a pad region PAD having a step. In an exemplary embodiment, the pad region PAD may form a stair structure in the first direction. The contacts CNT may be connected to the pad region PAD. The cell channel structures CH may extend in the first direction, which is substantially perpendicular to an upper surface of the substrate 101.

The gate electrode layers 10 may provide a lowermost ground select line GSL closest to the substrate 101, word lines WL (10b to 10j) disposed on the ground select line GSL, and a string select line SSL disposed on the word lines WL. The ground select line GSL and string select line SSL may each be formed as a multi-layer structure. The gate electrode layers 10 may further include a dummy word line disposed between an uppermost word line 10j farthest from the substrate 101 and the string select line SSL (10k) and/or between the lowest word line 10b closest to the substrate 101 and the ground select line GSL (10a). The gate electrode layers 10 may each include a metal material such as, for example, tungsten, copper, metal silicide, etc. The interlayer insulating layer 20 may include an oxide-based material such as, for example, silicon oxide, silicon oxycarbide, or silicon oxynitride.

A cell channel structure CH may extend substantially perpendicularly to an upper surface of the substrate 101 in the cell region CEL such that it passes through the gate electrode layers 10 and the interlayer insulating layers 20. The cell channel structures CH may be disposed in a second direction such that it defines a plurality of pad rows, and the plurality of pad rows may be disposed in a third direction. The cell channel structures CH may be disposed in a zigzag form on a flat surface. In an exemplary embodiment, a semiconductor pattern may be further disposed between the cell channel structure CH and the upper surface of the substrate 101. The semiconductor pattern may include, for example, single crystal silicon or polysilicon.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

The gate electrode layers 10 may surround the cell channel structures CH. Further, the gate electrode layers 10 may be spaced apart from each other in the first direction. Further, the gate electrode layers 10 may extend in the second direction, which is substantially perpendicular to the first direction.

Referring to FIG. 5, the cell channel structure CH may include a channel 31, a dielectric film structure 32, and a buried insulating pattern 33. The channel 31 may have a hollow cylinder shape or a hollow cup shape. For example, the channel 31 may include an outer surface that forms an open inner space therein. The channel 31 may include polysilicon or single crystal silicon and may include a p-type impurity such as, for example, boron (B) in some regions. The buried insulating pattern 33 may be disposed in the inner space of the channel 31 in a pillar shape or a solid cylindrical shape. In an exemplary embodiment, the buried insulating pattern 33 may fill the inner space of the channel 31. The buried insulating pattern 33 may include an insulating material such as, for example, silicon oxide. In an exemplary embodiment, the channel 31 may have a pillar shape or solid cylindrical shape. For example, the channel 31 may not include an open inner space therein. In this case, the buried insulating pattern 33 may be omitted. The dielectric film structure 32 may surround an outer wall of the channel 31 and may have a substantially straw or cylinder shell shape.

The dielectric film structure 32 may include a tunnel insulating film 32T, a charge storage film 32E, and a blocking film 32B, which are sequentially stacked from the outer wall of the channel 31. The blocking film 32B may include a metal oxide such as, for example, silicon oxide, hafnium oxide, or aluminum oxide. The charge storage film 32E may include a nitride such as, for example, silicon nitride or a metal oxide, and the tunnel insulating film 32T may include an oxide such as, for example, silicon oxide. In an exemplary embodiment, the dielectric film structure 32 may have an oxide-nitride-oxide (ONO) stack structure in which an oxide film, a nitride film, and an oxide film are sequentially stacked.

In an exemplary embodiment, the gate structure GS may further include an interface pattern 32BK2 surrounding an outer wall of the gate electrode layer 10. The interface pattern 32BK2 may include a metal oxide such as, for example, aluminum oxide, and/or a metal nitride such as, for example, tungsten nitride, titanium nitride, tantalum nitride, etc.

Referring back to FIGS. 1A, 1B and 2 to 4, a pad 34 may be formed on the cell channel structure CH. For example, the pad 34 may be electrically connected to the bit line BL and may serve as a source/drain for transferring charges into the channel 31. The pad 34 may include polysilicon or single crystal silicon and may further include an n-type impurity such as, for example, phosphorus (P), arsenic (As), etc.

The dummy channel structure DCH may extend in a direction substantially perpendicular to the upper surface of the substrate 101 in the extension region EXT such that it passes through the gate electrode layers 10 and the mold insulating layer 40. The dummy channel structure DCH may have a structure similar to that of the cell channel structure CH. However, unlike the cell channel structure CH, in an exemplary embodiment, the dummy channel structure DCH is not electrically connected to the bit line BL. The dummy channel structure DCH may be provided to secure structural stability during a manufacturing process. That is, in an exemplary embodiment, the cell channel structure CH is electrically connected to the bit line BL, and the dummy channel structure DCH is not electrically connected to the bit line and provides structural stability.

The word line cuts WLC may be disposed substantially in parallel with the third direction. For example, the word line cuts WLC may be disposed adjacent to each other in the third direction. At least some among the word line cuts WLC may have the same shape, and parts of the word line cuts WLC corresponding to each other in the third direction may have the same width in the third direction.

The word line cuts WLC may extend in the second direction such that they cut the gate structure GS and the mold insulating layer 40 in the second direction. For example, the word line cuts WLC may extend lengthwise in the second direction. The word line cuts WLC may extend continuously in the second direction. For example, the word line cuts WLC may continuously extend in the second direction without any breaks or openings therein. The gate electrode layers 10 and the interlayer insulating layers 20 may be divided into a plurality of blocks BK1 and BK2 by the word line cut WLC. The gate electrode layers 10 providing word lines in the blocks BK1 and BK2 may be separated into two unit electrodes UA1 and UA2 and two unit electrodes UA3 and UA4 by the word line cut WLC. For example, nine channel rows may be disposed in one unit electrode. The word line cuts WLC may cut the gate electrode layers 10 in the first direction.

In an exemplary embodiment, identical extension word line cuts WLC1 may be alternately disposed substantially in parallel with the remaining word line cuts WLC other than the extension word line cuts WLC1 in the third direction.

The common source line 50 may be disposed inside the word line cut WLC. The insulating spacer 53 may be formed on sidewalls of the common source line 50 and may extend with the common source line 50 in the second direction. The common source line 50 may be connected to a source region of the substrate 101. The source region may be formed by implanting an impurity having a specific conductivity type into the substrate 101. For example, the source region may be a region doped with an n-type impurity.

The separation insulating pattern SSC separates some gate electrode layers 10 from among the gate electrode layers 10, which are disposed in an upper portion of the gate electrode layers 10, in the third direction. For example, the separation insulating pattern SSC may separate two uppermost gate electrode layers 10k and 10l in the third direction. The separation insulating pattern SSC may separate one unit electrode UA1, UA2, UA3 or UA4 into two lower unit electrodes. The blocks BK1 and BK2, each including the two unit electrodes UA1 and UA2 and the two unit electrodes UA3 and UA4, may include four lower unit electrodes. The four lower unit electrodes separated from each other may provide four string select lines SSL to each of the blocks BK1 and BK2.

The contacts CNT may be disposed in the extension region EXT. The contacts CNT may be connected to the pad regions PAD of the gate electrode layers 10 by passing through the mold insulating layer 40 and the interlayer insulating layer 20. In FIGS. 1A and 1B, the contacts CNT are shown as being disposed in each of the pad regions PAD. However, the inventive concept is not limited thereto. For example, in an exemplary embodiment, some of the contacts CNT may be omitted. Thus, in an exemplary embodiment, some pad regions PAD have the contacts CNT disposed therein, and one or more pad regions PAD do not have the contacts CNT disposed therein.

The word line cut WLC may include at least one first word line cut WLC1 and a plurality of second word line cuts WLC2. In some regions, the first word line cut WLC1 may include an extension portion 60 extending in width in the third direction. For example, the first word line cut WLC1 extends lengthwise in the second direction, and its width extends in the third direction. The first word line cut WLC1 may have substantially the same width in the second direction except for the extension portion 60, which has a different width than the remaining portion of the first word line cut WLC1. For example, the width of the extension portion 60 in the third direction may be greater than the width of the remaining portion of the first word line cut WLC1 in the third direction. In an exemplary embodiment, the extension portions 60 of multiple word line cuts WLC may be aligned with each other in the second direction. In an exemplary embodiment, the extension portion 60 is disposed in the cell region CEL in an area close to the extension region EXT. For example, the extension portion 60 may be disposed in the cell region CEL in an area adjacent to the extension region EXT. The area in the cell region CEL in which the extension portion 60 is disposed may be directly adjacent to the extension region EXT, or a space may exist between the area and the extension region EXT. As shown in FIGS. 1A and 1B, the extension portion 60 may be disposed in the cell region CEL and extend into the extension region EXT from the cell region CEL in the second direction. Hereinafter, the first word line cut WLC1 may be referred to as an extension word line cut WLC1.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. For example, when two or more elements or values are substantially the same as or about equal to each other but are not identical to each other, it is to be understood that the two or more elements or values are approximately the same as or equal to each other within a measurement error as would be understood by a person having ordinary skill in the art.

In an exemplary embodiment, as shown in FIG. 1A, the first word line cut WLC1 including the extension portion 60 may be disposed adjacent to both sidewalls of the gate structure GS. A not-open phenomenon may easily occur at the word line cuts WLC disposed adjacent to both of the sidewalls of the gate structure GS. A not-open phenomenon may refer to a phenomenon in which a word line cut WLC is intended to provide an opening (or space) between adjacent structures, but the opening (or space) is not formed or maintained during and/or after manufacture. In FIG. 1A, one extension word line cut WLC1 is shown as being disposed on each of both sidewalls of the gate structure GS. However, the inventive concept is not limited thereto. The extension word line cut WLC1 may be disposed with a predetermined pattern or an irregular pattern in the third direction. For example, referring to FIG. 1B, in the semiconductor device 100, the extension word line cut WLC1 including the extension portion 60 and a second word line cut WLC2 not including the extension portion 60 may be alternately disposed in parallel in the third direction.

In an exemplary embodiment, in a plan view, the extension word line cut WLC1 is disposed adjacent to both sidewalls of each of the gate electrode layers 10 spaced apart from each other in the third direction substantially perpendicular to the second direction.

In an exemplary embodiment, the common source line 50 may include at least one first common source line 51 and a plurality of second common source lines 52. The first common source line 51 may be disposed in the first word line cut WLC1 and the second common source line 52 may be disposed in the second word line cut WLC2. The first common source line 51 may include an extension pattern having an area (or a width in the third direction) different from those of other common source lines 50 at a predetermined position.

In an exemplary embodiment, the extension portion 60 of the word line cut WLC and the extension pattern of the first common source line 51 disposed within the extension portion 60 may be disposed in the vicinity of a position at which the cell region CEL and the extension region EXT are in contact with each other. A position at which the extension portion 60 of the word line cut WLC is formed may be a position at which a not-open phenomenon may easily occur during an etching process of forming the word line cut WLC.

FIGS. 6, 7, 8A and 8B are plan views illustrating a portion of the gate electrode layer shown in FIG. 1A. In FIGS. 1A, 1B, 2 to 7, 8A and 8B, the same reference numerals denote the same components. For convenience of explanation, a further description of components and technical aspects previously described will be omitted below.

Figure 6:
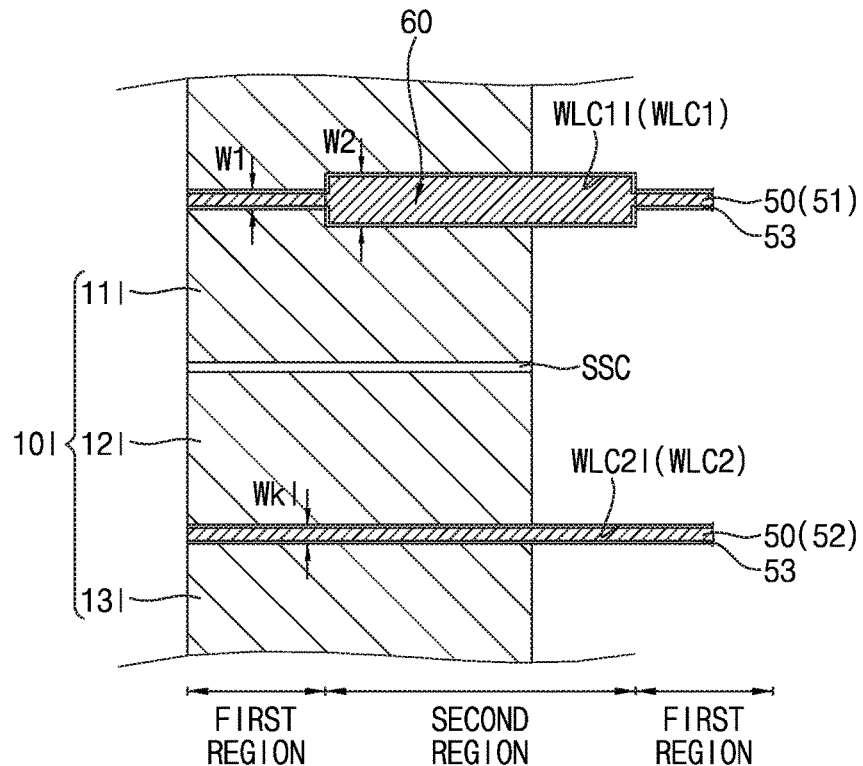
FIGS. 6, 7, 8A and 8B are plan views illustrating a portion of the gate electrode layer shown in FIG. 1A.

Referring to FIG. 6, word line cuts WLC11 and WLC21, the common source lines 50 disposed in the word line cuts WLC11 and WLC21, and the separation insulating pattern SSC may divide the uppermost gate electrode layer 10$l$ provided as the string select line SSL into a plurality of lower unit electrodes 11$l$, 12$l$, and 13$l$. In an exemplary embodiment, the extension word line cut WLC1 may include a first portion and a second portion which have different widths in the third direction. For example, the first portion may have a relatively narrow first width W1, and the second portion may have a relatively wide second width W2. For example, the first width W1 may be smaller than the second width W2. The second portion having the second width W2 corresponds to the above-described extension portion 60.

The gate structure GS may be divided into a first region, in which the first portion is disposed, and a second region, in which the second portion is disposed. For example, the second portion of the extension word line cut WLC1 having the second width W2 (i.e., the extension portion 60) may be disposed in the second region, and the remaining portion of the extension word line cut WLC1 having the first width W1 may be disposed in the first region. The first width W1 of the first portion (or an area of the first portion) (i.e., the remaining portion) may be substantially equal to a width Wk1 (or an area) of a portion disposed in the first region of the second word line cut WLC2 not including the extension portion 60. The second width W2 of the second portion (or an area of the second portion) may be different from the width Wk1 (or the area) of a portion disposed in the second region of the second word line cut WLC2. For example, the area of the second portion of the extension word line cut WLC1 may be relatively greater than an area of a corresponding portion of the second word line cut WLC2 in the third direction.

In an exemplary embodiment, an uppermost extension word line cut WLC1 may include an uppermost extension portion 60 located at a level that is equal to that of an uppermost gate electrode layer 10 located at an uppermost level from among the gate electrode layers 10. Further, a lowest extension word line cut WLC1 may include a lowermost extension portion 60 located at a level that is equal to that of a lowermost gate electrode layer 10 located at a lowermost level from among the gate electrode layers 10, and having an area that is relatively smaller than that of the uppermost extension portion 60. The lowermost extension portion 60 may have a width that is greater than or equal to that of a portion disposed in a region except for a predetermined region among the word line cuts WLC located at the same level as the lowermost extension portion 60.

Figure 7:
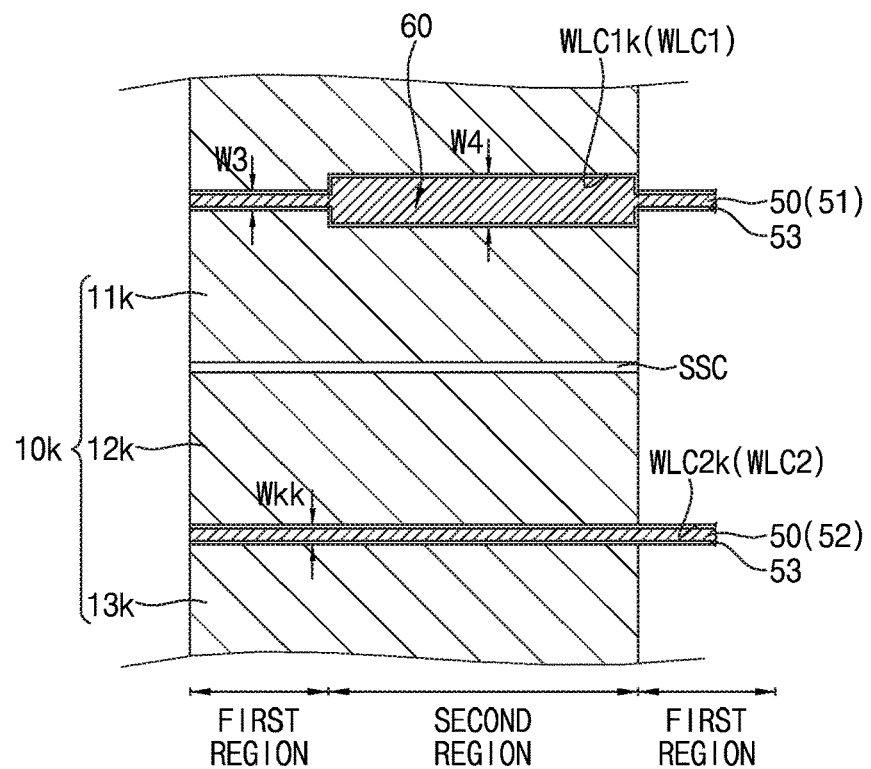

Referring to FIG. 7, word line cuts WLC1$k$ and WLC2$k$, the common source lines 50, and the separation insulating pattern SSC may divide an upper gate electrode layer 10$k$ provided as the string select line SSL into a plurality of lower unit electrodes 11$k$, 12$k$ and 13$k$. Similar to FIG. 6, the extension word line cut (WLC1$k$) may include a third portion and a fourth portion which have different widths in the third direction. The third portion may be disposed in the first region, and the fourth portion may be disposed in the second region. The third portion may have a relatively narrow third width W3, and the fourth portion may have a relatively wide fourth width W4. The fourth portion having the fourth width W4 may correspond to the above-described extension portion 60. For example, the third width W3 may be smaller than the fourth width W4. Referring to FIGS. 6 and 7, a value of W4/W3 may be substantially smaller than or equal to a value of W2/W1.

Figure 8A:
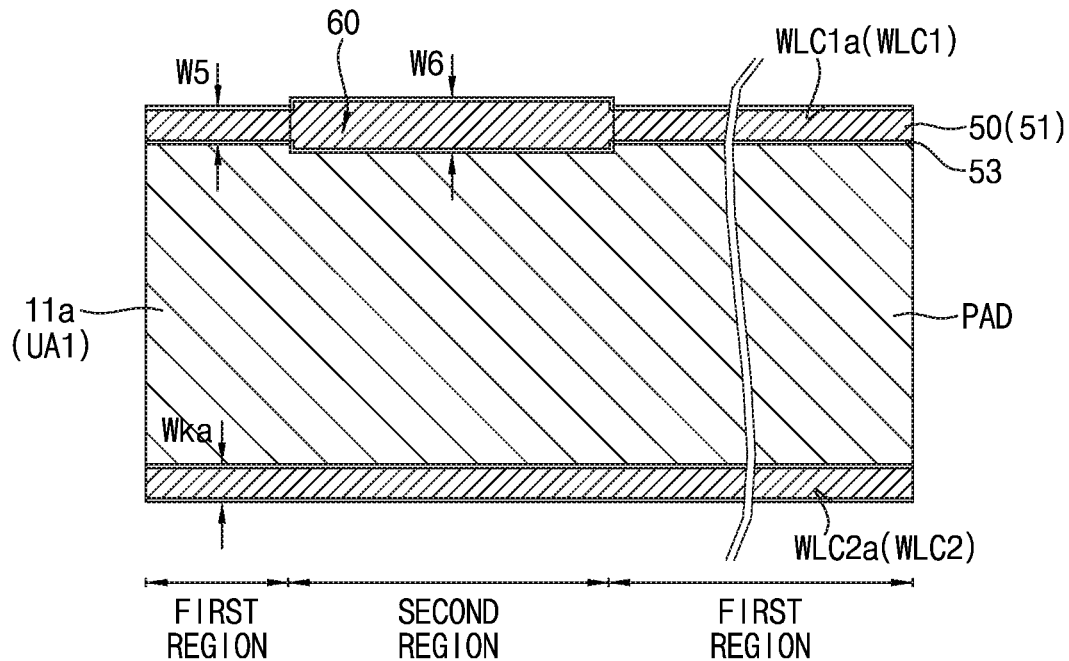

Referring to FIGS. 1A and 8A, word line cuts WLC1a and WLC2a and the common source lines 50 may divide the lowest gate electrode layer 10a provided as the ground select line GSL into a plurality of unit electrodes UA1 (11a) and UA2. In an exemplary embodiment, the extension word line cut WLC1a may include a fifth portion and a sixth portion which have different widths in the third direction. The fifth portion may be disposed in the first region, and the sixth portion may be disposed in the second region. For example, the fifth portion may have a relatively narrow fifth width W5, and the sixth portion may have a relatively wide sixth width W6. The sixth portion having the sixth width W6 may correspond to the above-described extension portion 60. The fifth width W5 may be smaller than the sixth width W6. The fifth width W5 may be substantially smaller than or equal to the first width W1 (see FIG. 6) and/or the third width W3 (see FIG. 7). The sixth width W6 may be smaller than the second width W2 (see FIG. 6) and/or the fourth width W4 (see FIG. 7). The fifth width W5 may be substantially equal to the width Wka. Referring to FIGS. 6 and 8A, a value of W6/W5 may be smaller than W2/W1.

Figure 8B:
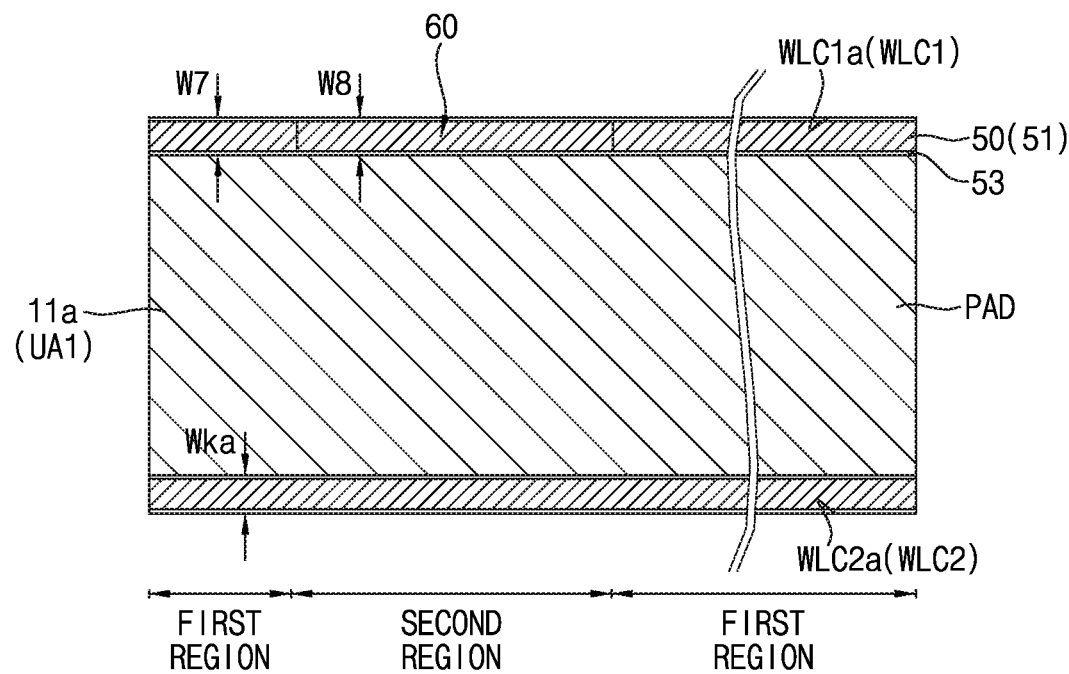

Referring to FIG. 8B, in an exemplary embodiment, the extension word line cut WLC1a located at a level that is equal to that of the lowermost gate electrode layer 10a may be formed such that a seventh width W7 of a portion disposed in the first region is substantially equal to an eighth width W8 of a portion disposed in the second region. The seventh width W7 and the eighth width W8 may be substantially equal to the width Wka.

Figure 9A:
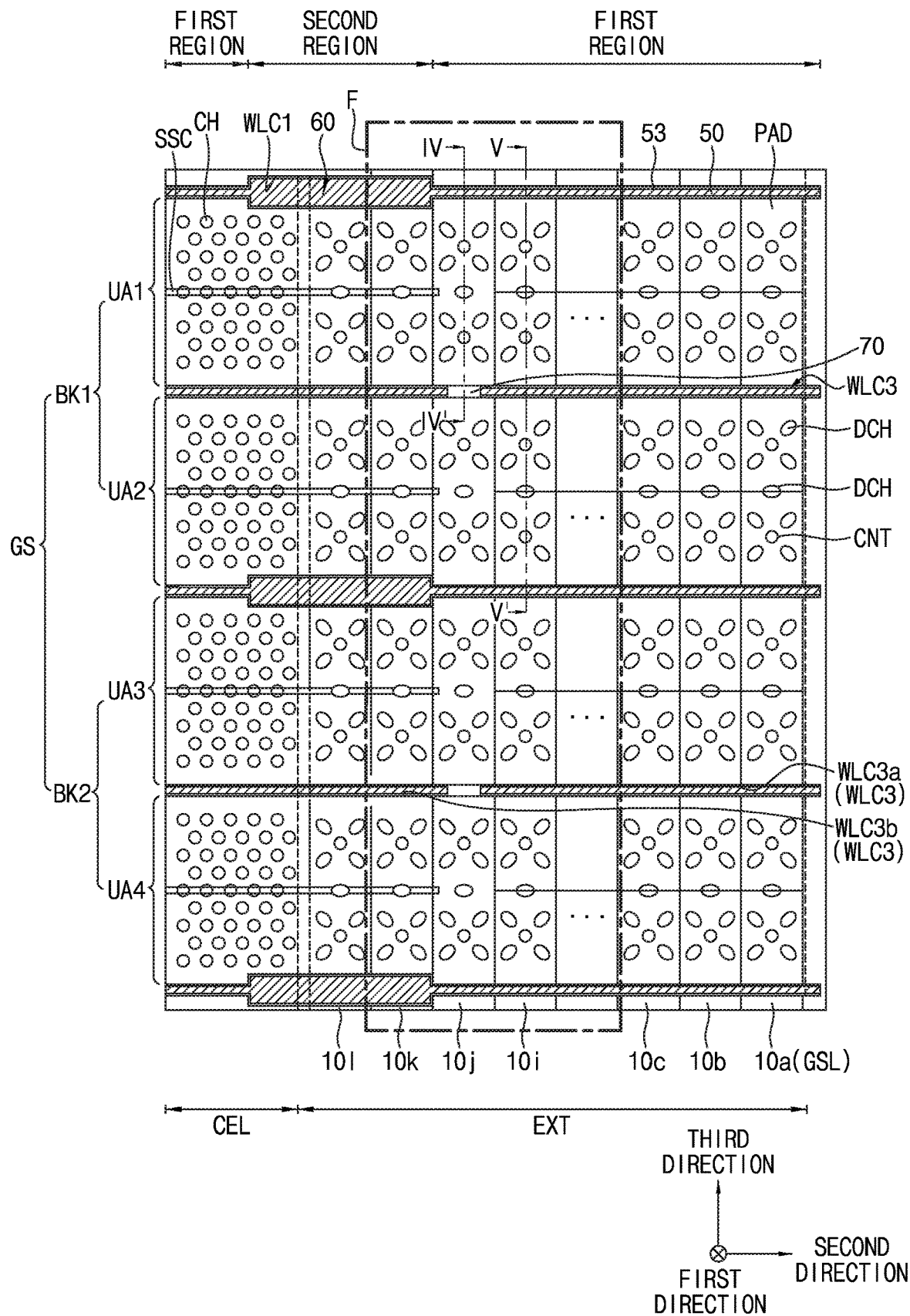
FIG. 9A is a layout schematically illustrating a semiconductor device according to an exemplary embodiment of the inventive concept.
Figure 9B:
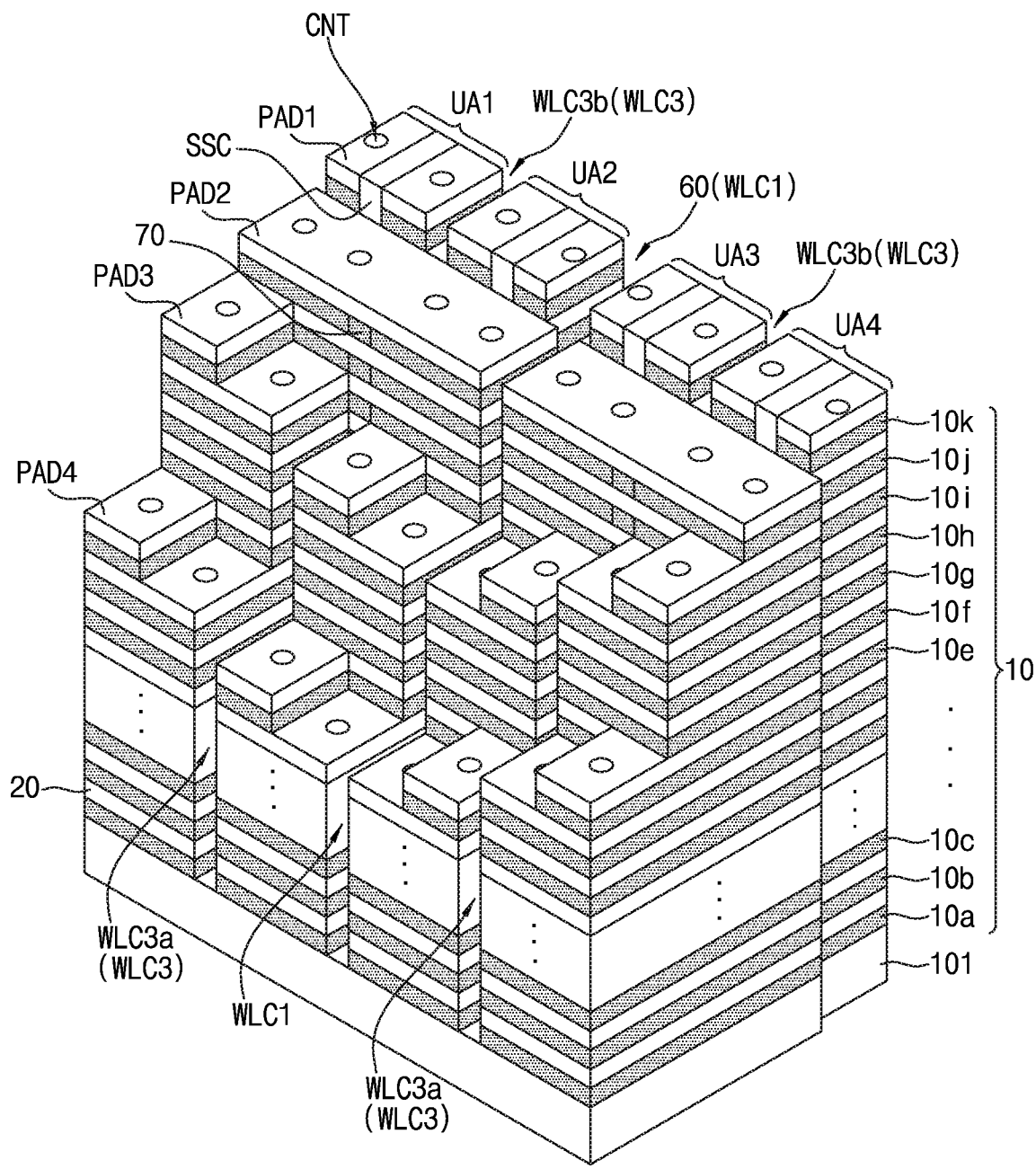
FIG. 9B is a perspective view of area F of FIG. 9A.
Figure 10:
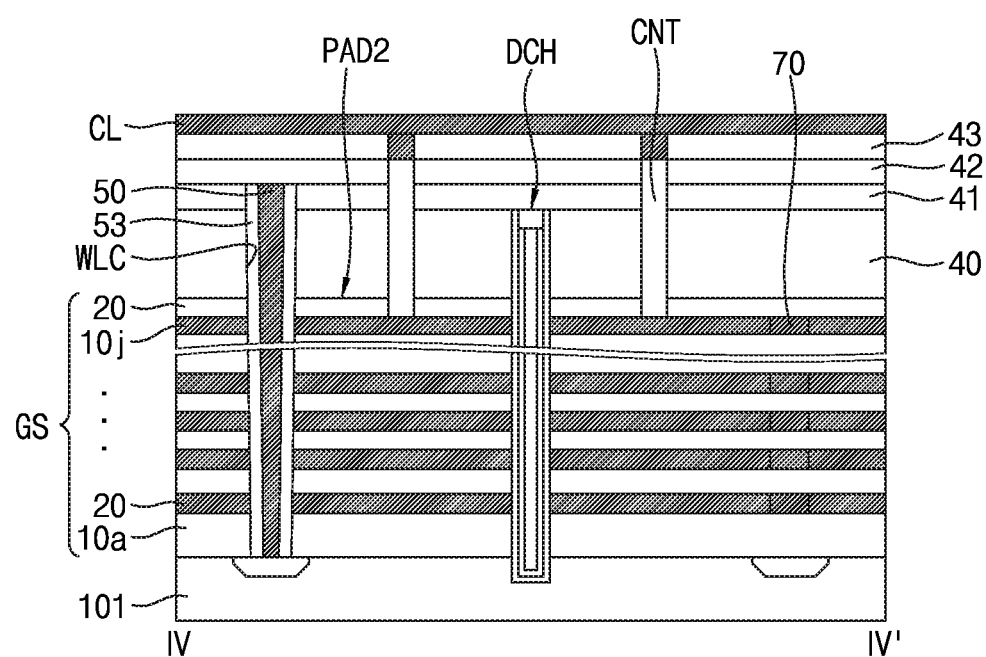
FIG. 10 is a sectional view taken along line IV-IV' of FIG. 9A.
Figure 11:
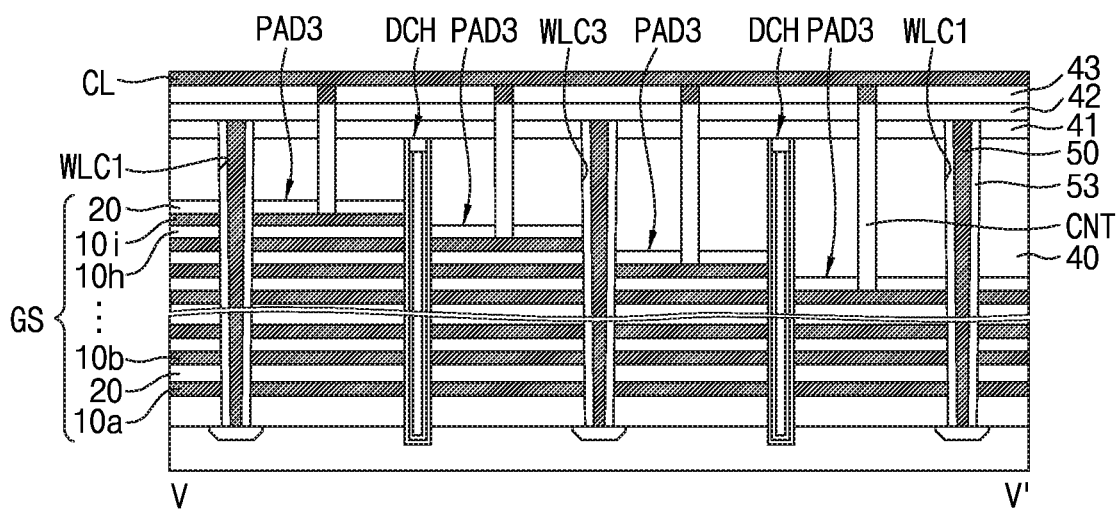
FIG. 11 is a sectional view taken along line V-V' of FIG. 9A.

FIG. 9A is a layout schematically illustrating a semiconductor device according to an exemplary embodiment of the inventive concept. FIG. 9B is a perspective view of area F of FIG. 9A. FIG. 10 is a cross-sectional view taken along line IV-IV' of FIG. 9A. FIG. 11 is a cross-sectional view taken along line V-V' of FIG. 9A. In FIG. 9B, for convenience of description, some components shown in area F of FIG. 9A are omitted. In FIGS. 1A, 1B, 2 to 7, 8A, 8B, 9A, 9B, 10 and 11, the same reference numerals denote the same components. For convenience of explanation, a further description of components and technical aspects previously described will be omitted below.

Referring to FIGS. 9A, 9B, 10 and 11, the semiconductor device 100 may include the gate structure GS, connectors 70, the cell channel structures CH, the dummy channel structures DCH, the extension word line cuts WLC1, separation word line cuts WLC3, the common source lines 50, and the contacts CNT.

In an exemplary embodiment, the gate structure GS may be formed such that the gate electrode layers 10 and the interlayer insulating layers 20 are alternately stacked in a first direction substantially perpendicular to the substrate 101. The gate structure GS may be divided into the plurality of blocks BK1 and BK2 by the word line cuts WLC1 and WLC3 extending in the first direction. The common source line 50 and the insulating spacer 53 may be disposed in each of the word line cuts WLC1 and WLC3.

The gate electrode layers 10 and the interlayer insulating layers 20 may be paired, and the gate electrode layers 10 may extend with different lengths in a second direction such that pad regions PAD (PAD1 to PAD4) are provided, each having a step. Some of the pad regions PAD may have steps in both the second direction and a third direction. The pad regions PAD may form a first cascade structure in the second direction. As shown in FIGS. 9B and 11, a third pad region PAD3 may have a step with another third pad region PAD3 disposed adjacent thereto and may form a second stair structure in the third direction. A fourth pad region PAD4 may also have a step with another fourth pad region PAD4 disposed adjacent thereto and may form the second stair structure in the third direction.

The gate structure GS may include a first block BK1 and a second block BK2. The first block BK1 and the second block BK2 may each have a structure in which each of the plurality of pad regions PAD (PAD1 to PAD4) is disposed mirror-symmetrically. In an exemplary embodiment, the structures of the pad regions PAD in the first block BK1 are identical to those of the pad regions PAD in the second block BK2.

The separation word line cut WLC3 may include a first separation word line cut WLC3a and a second separation word line cut WLC3b. The connector 70 may be disposed between the first separation word line cut WLC3a and the second separation word line cut WLC3b. The first separation word line cut WLC3a may extend lengthwise from the connector 70 to the extension region EXT in the second direction, and the second separation word line cut WLC3b may extend lengthwise from the connector 70 to the cell region CEL in the second direction. An extension word line cut WLC1 may be disposed between two adjacent separation word line cuts (e.g., the first and second separation word line cuts WLC3a and WLC3b) in the third direction.

The connector 70 may divide the separation word line cut WLC3 into the first separation word line cut WLC3a and the second separation word line cut WLC3b. The connectors 70 may be formed to protrude from the gate electrode layers 10a to 10j, which extend in the second direction, in the third direction. The connectors 70 may connect the two unit electrodes UA1 and UA2 located at the same level with each other and the two unit electrodes UA3 and UA4 located at the same level with each other among the gate electrode layers 10a to 10j. In an exemplary embodiment, the connector 70 may be disposed in a region corresponding to the second pad region PAD2 in the third direction in a plan view thereof. In an exemplary embodiment, the connector 70 is not connected to the gate electrode layers 10l and 10k provided as the string select line SSL in the gate structure GS.

The extension word line cut WLC1 may include the extension portion 60. The extension portion 60 may have a width and an area in the third direction that are greater than those of a portion corresponding to the extension portion 60 of the separation word line cut WLC3 in the third direction. When the semiconductor device 100 does not include the extension word line cut WLC1 (i.e., when the extension portion 60 is not present), a loading effect may occur due to a mask pattern disposed on the connector 70 during a process of forming the word line cut. Due to the loading effect, a not-open phenomenon of the lowest gate electrode layer (the ground select line GSL) may occur. Accordingly, the semiconductor device 100 according to exemplary embodiments of the inventive concept may prevent the not-open phenomenon by forming the extension portion 60 having a large area at a position at which the loading effect occurs due to the connector 70.

As shown in FIG. 9B, in an exemplary embodiment, the extension portion 60 of the extension word line cut WLC1 has an area (or width) that is different from areas (or widths) of the remaining word line cuts (e.g., WLC3b) that are not extension word line cuts located at the same level in a predetermined region in the second direction. This configuration may also apply to the word line cuts illustrated in FIGS. 1A, 1B, 2 to 7, 8A and 8B.

Also as shown in FIG. 9B, in an exemplary embodiment, the gate electrode layers 10 may be stacked in the form of a cascade shape so as to be spaced apart from each other in the first direction and to extend in the second direction, which is substantially perpendicular to the first direction.

Figure 12:
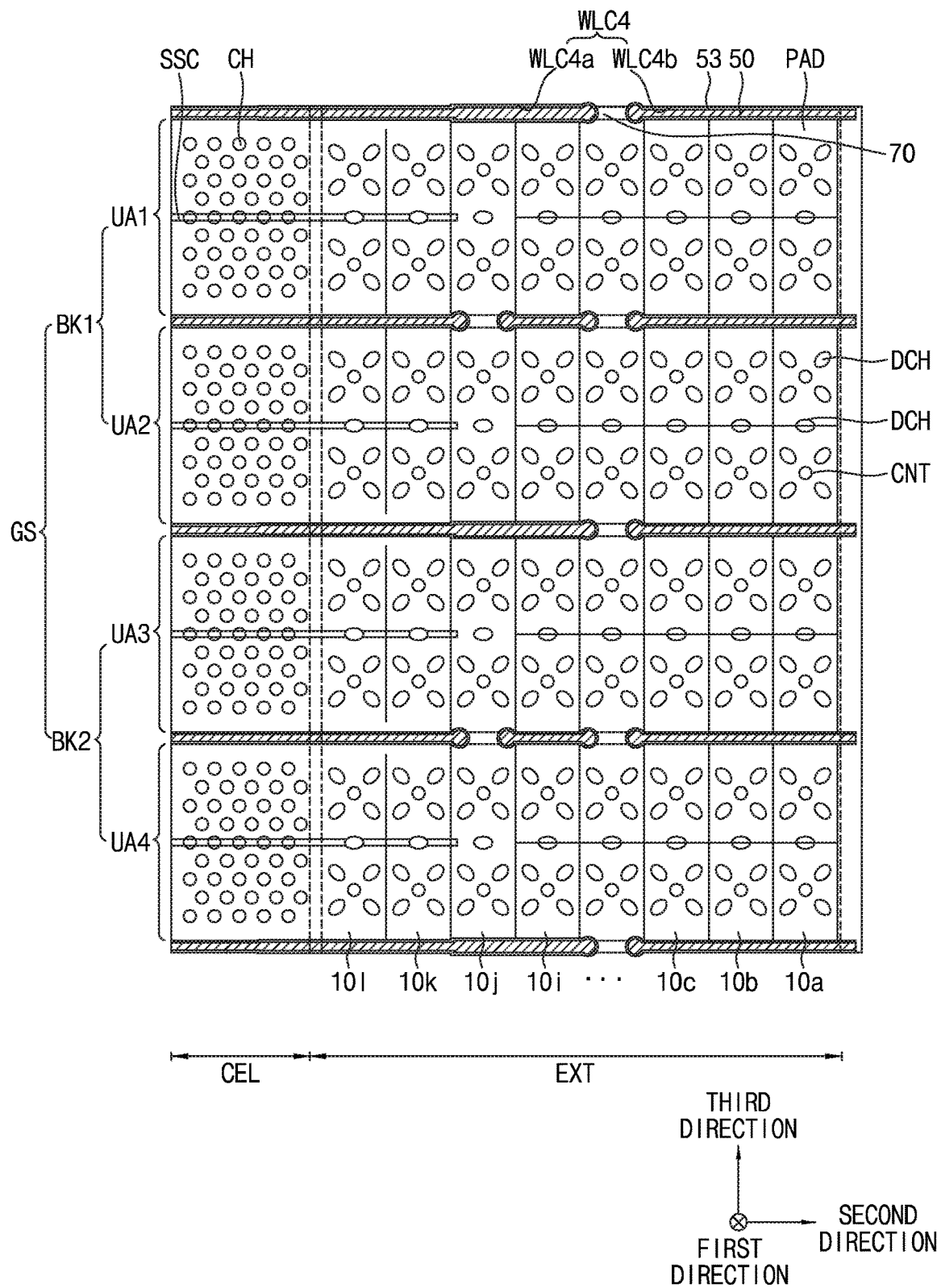
FIG. 12 is a layout schematically illustrating a semiconductor device according to an exemplary embodiment of the inventive concept.

FIG. 12 is a layout schematically illustrating a semiconductor device according to an exemplary embodiment of the inventive concept. In FIGS. 1A, 1B, 2 to 7, 8A, 8B, 9A, 9B and 10 to 12, the same reference numerals denote the same components. For convenience of explanation, a further description of components and technical aspects previously described will be omitted below.

Referring to FIG. 12, the semiconductor device 100 may include extension separation word line cuts WLC4, each having a width which is gradually increased in a third direction, common source lines 50 disposed in the extension separation word line cuts WLC4, and insulating spacers 53. The extension separation word line cut WLC4 may include a first extension separation word line cut WLC4a and a second extension separation word line cut WLC4b. The connector 70 may be disposed between the first extension separation word line cut WLC4a and the second extension separation word line cut WLC4b. The first extension separation word line cut WLC4a may extend lengthwise from the connector 70 to the cell region CEL in a second direction, and the second extension separation word line cut WLC4b may extend lengthwise from the connector 70 to the extension region EXT in the second direction.

In an exemplary embodiment, a width of at least one of the first extension separation word line cut WLC4a and the second extension separation word line cut WLC4b may be gradually increased in the third direction as they get closer to the connector 70 in the second direction. For example, as at least one of the first extension separation word line cut WLC4a and the second extension separation word line cut WLC4b extend lengthwise in the second direction toward the connector 70, the width thereof gradually increases in the third direction. In FIG. 12, although only a width of the first extension separation word line cut WLC4a is shown as being gradually increased in the third direction, the inventive concept is not limited thereto. For example, in an exemplary embodiment, a width of the second extension separation word line cut WLC4b may also be gradually increased in the third direction. A step may be formed on the extension separation word line cut WLC4, and a width of a portion adjacent to the connector 70 in the third direction about the step may be greater than a width of a portion further from the connector 70 in the third direction.

A width of the common source line 50 disposed in the extension separation word line cut WLC4 having the width which is gradually increased in the third direction may also be gradually increased as the common source line 50 gets closer to the connector 70 in the second direction. A step may also be formed on a sidewall of the common source line 50, and a width of a portion adjacent to the connector 70 in the third direction with respect to the step may be greater than a width of a portion further from the connector 70 in the third direction.

According to exemplary embodiments of the inventive concept, a plurality of word lines formed on the same layer of a semiconductor device may be connected to each other by a connector. During a process of forming a word line cut, the semiconductor device can prevent a not-open phenomenon from occurring by including an extension portion at a position affected by a loading effect due to the connector. As a result, contacts and/or line structures of the semiconductor device are reduced through the connector such that the reliability of the semiconductor device is improved, while also increasing the capacity and integration density of the semiconductor device. Further, only an area of the extension portion is increased without increasing an entire area of the word line cut, such that reliability of the semiconductor device can be secured by entirely securing a separation distance between the word line cut and channels.

In exemplary embodiments of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   a substrate comprising a cell region and an extension region;
   a plurality of channel structures disposed in the cell region and extending in a first direction substantially perpendicular to an upper surface of the substrate;
   a plurality of gate electrode layers surrounding the channel structures, wherein the gate electrode layers are spaced apart from each other in the first direction and extend in a second direction substantially perpendicular to the first direction; and
   a plurality of word line cuts cutting the gate electrode layers in the first direction and continuously extending in the second direction,
   wherein at least one of the word line cuts is an extension word line cut comprising an extension portion,
   wherein, in a first predetermined region extending in the second direction, the extension portion has an area that is different from an area of each of the remaining word line cuts other than the at least one word line cut as compared to one another in a third direction that is substantially perpendicular to the second direction,
wherein the area of the extension portion of the at least one word line cut is greater than an area of the remainder of the at least one word line cut other than the extension portion, and the extension portion is a single, continuous portion.

2. The semiconductor device of claim 1, wherein the area of the extension portion is greater than the area of each of the remaining word line cuts other than the at least one word line cut in the first predetermined region.

3. The semiconductor device of claim 1, wherein the extension portion is disposed in the cell region in an area adjacent to the extension region.

4. The semiconductor device of claim 1, wherein the extension portion is disposed in the cell region and extends into the extension region in the second direction.

5. The semiconductor device of claim 1, wherein, in a plan view, the extension word line cut is disposed adjacent to both sidewalls of each of the gate electrode layers spaced apart from each other in the third direction.

6. The semiconductor device of claim 1, wherein the extension word line cut is one of a plurality of identical extension word line cuts, and the extension word line cuts are alternately disposed substantially in parallel with the remaining word line cuts other than the extension word line cuts in the third direction.

7. The semiconductor device of claim 1, further comprising:
an insulating common source line spacer disposed in each of the word line cuts; and
a conductive common source line disposed in each of the word line cuts.

8. The semiconductor device of claim 1, wherein the extension portion comprises:
an uppermost extension portion located at a level that is equal to that of an uppermost gate electrode layer located at an uppermost level from among the gate electrode layers; and
a lowermost extension portion located at a level that is equal to that of a lowermost gate electrode layer located at a lowermost level from among the gate electrode layers and having an area that is relatively smaller than that of the uppermost extension portion.

9. The semiconductor device of claim 8, wherein the lowermost extension portion has a width that is greater than or equal to that of a portion disposed in a region except for a second predetermined region among the word line cuts located at the same level as the lowermost extension portion.

10. A semiconductor device, comprising:
a substrate;
a plurality of channel structures extending in a first direction substantially perpendicular to an upper surface of the substrate;
a plurality of gate electrode layers surrounding the channel structures, wherein the gate electrode layers are stacked in a form of a cascade shape so as to be spaced apart from each other in the first direction and to extend in a second direction substantially perpendicular to the first direction;
a plurality of word line cuts cutting the gate electrode layers in the first direction and extending in the second direction; and
a connector connecting gate electrode layers disposed on a same layer and protruding from each of the gate electrode layers,
wherein
the word line cuts comprise extension word line cuts having an extension portion, and separation word line cuts separated by the connector,
each of the gate electrode layers comprises a ground select line, a word line, and a string select line which are sequentially stacked from an upper surface of the substrate in the first direction,
the string select lines are separated from each other and extend on the same layer, and
the word lines are connected by the connector and extend on the same layer.

11. The semiconductor device of claim 10, wherein the extension portion is disposed in a predetermined region extending in a third direction substantially perpendicular to the second direction, and has an area that is greater than an area of a portion disposed in the predetermined region among the separation word line cuts.

12. The semiconductor device of claim 10, wherein at least one of the extension word line cuts is disposed between adjacent separation word line cuts in a third direction substantially perpendicular to the second direction.

13. The semiconductor device of claim 10, wherein:
the substrate comprises a cell region in which a plurality of cell channel structures is disposed and an extension region in which a plurality of pad regions in a form of a stair shape is disposed; and
the extension portion is disposed in the cell region and the connector is disposed in the extension region.

14. The semiconductor device of claim 13, wherein the extension portion extends from the cell region into the extension region in the second direction.

15. The semiconductor device of claim 14, wherein the extension portion extends to the pad regions of the string select line in a plan view.

16. The semiconductor device of claim 14, wherein the extension portion located at a level that is equal to that of the string select line has an area that is relatively greater than that of the extension portion located at a level that is equal to that of the ground select line.

17. The semiconductor device of claim 16, wherein the extension portion located at a level that is equal to that of the ground select line has an area that is greater than or equal to that of a portion located at a level that is equal to that of the string select line and corresponding to the extension portion on the separation word line cut in a third direction substantially perpendicular to the second direction.

18. The semiconductor device of claim 10, wherein:
the substrate comprises a cell region in which cell channel structures are disposed and an extension region in which contacts connected to the gate electrode layers are disposed;
the separation word line cuts comprise a first separation word line cut extending toward the cell region with respect to the connector in the second direction, and a second separation word line cut extending toward the extension region with respect to the connector in the second direction; and
the extension portion is disposed at a position corresponding to the first separation word line cut in the second direction.

19. A semiconductor device, comprising:
a substrate;

a plurality of channel structures extending in a first direction substantially perpendicular to an upper surface of the substrate;
a plurality of gate electrode layers surrounding the channel structures, wherein the gate electrode layers are spaced apart from each other in the first direction and extend in a second direction substantially perpendicular to the first direction;
a plurality of common source lines cutting the gate electrode layers in the first direction and extending in the second direction; and
a connector connecting gate electrode layers disposed on the same layer and protruding from each of the gate electrode layers,
wherein at least one of the common source lines is separated by the connector, and
a width of the at least one common source line is gradually increased in the second direction toward the connector, and is not decreased in the second direction toward the connector.

* * * * *